(12) United States Patent
Trivedi

(10) Patent No.: US 6,335,254 B1
(45) Date of Patent: Jan. 1, 2002

(54) METHODS OF FORMING TRANSISTORS

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/635,279

(22) Filed: Aug. 9, 2000

(51) Int. Cl.$^7$ .................................................. H01L 21/336
(52) U.S. Cl. ........................ 438/305; 438/289; 438/291; 257/412; 257/413
(58) Field of Search ................................... 438/142, 289, 438/290, 291, 305; 257/336, 344, 412, 413, 407, 316

(56) References Cited

U.S. PATENT DOCUMENTS

| | | |
|---|---|---|
| 5,497,017 A | 3/1996 | Gonzales |
| 5,583,067 A * | 12/1996 | Sanchez ........................ 438/289 |
| 5,751,012 A | 5/1998 | Wolstenholme et al. |
| 5,874,328 A | 2/1999 | Liu et al. |
| 5,949,105 A * | 9/1999 | Moslehi ........................ 257/336 |
| 6,140,688 A * | 10/2000 | Gardner et al. ............... 257/412 |

* cited by examiner

Primary Examiner—David Nelms
Assistant Examiner—Dung A Le
(74) Attorney, Agent, or Firm—Wells, St. John, Roberts, Gregory & Matkin, P.S.

(57) ABSTRACT

In accordance with an aspect of the invention, a transistor is formed having a transistor gate, a gate dielectric layer and source/drain regions. The transistor gate includes at least two conductive layers of different conductive materials. One of the two conductive layers is more proximate the gate dielectric layer than the other of the two conductive layers. A source/drain reoxidation is conducted prior to forming the other conductive layer. In another aspect of the invention, a transistor has a transistor gate, a gate dielectric layer and source/drain regions. The transistor gate includes a tungsten layer. A source/drain reoxidation is conducted prior to forming the tungsten layer of the gate. In yet another aspect of the invention, a semiconductor processing method forms a transistor gate having insulative sidewall spacers thereover. After forming the insulative sidewall spacers, an outer conductive tungsten layer of the transistor gate is formed.

45 Claims, 5 Drawing Sheets

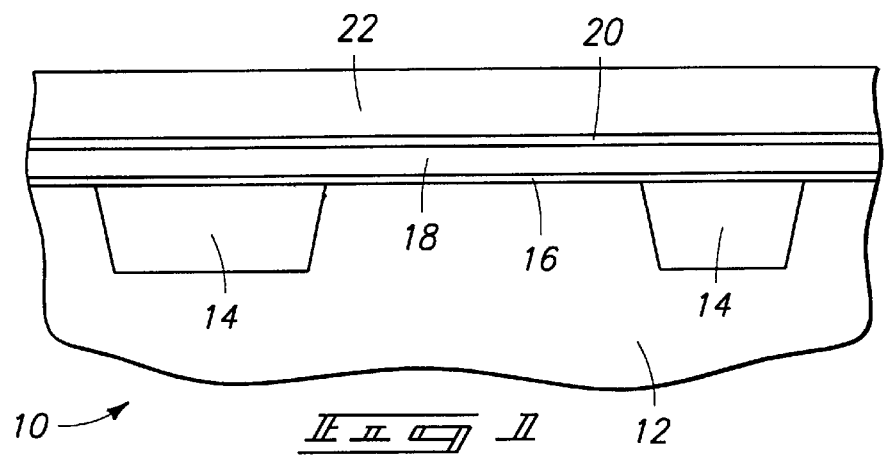
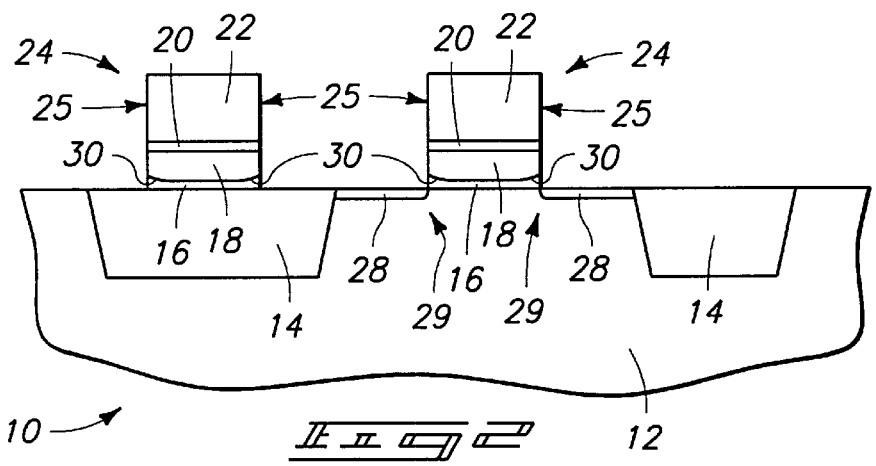
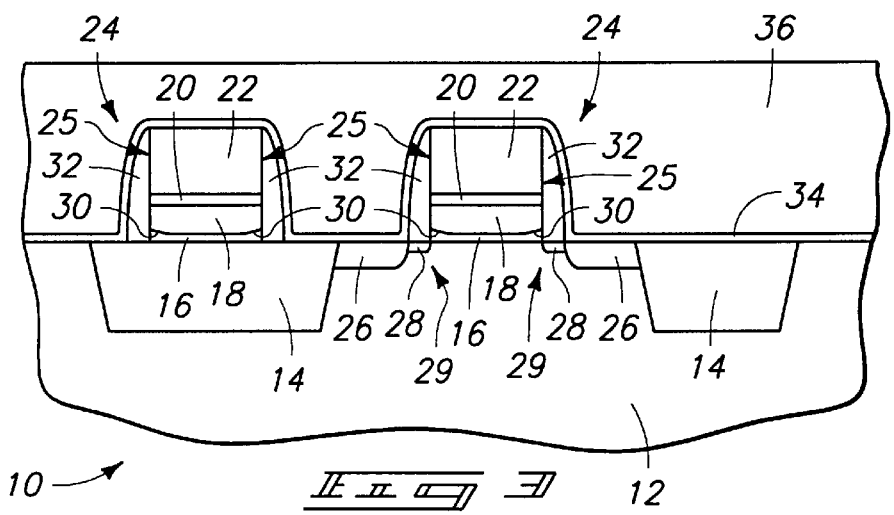

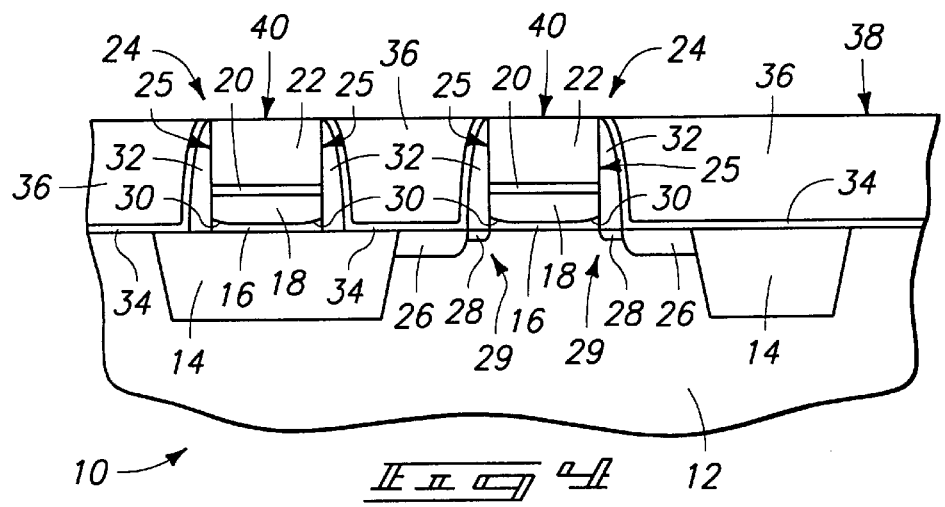
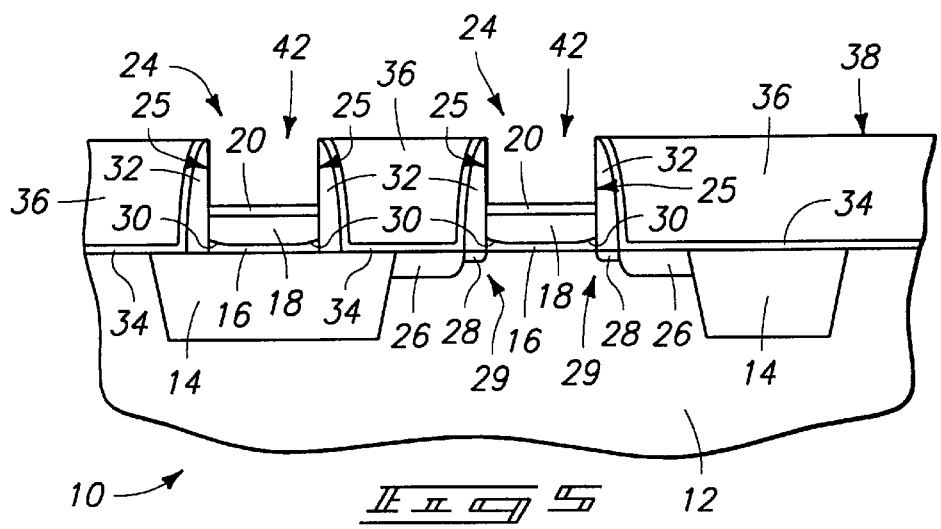
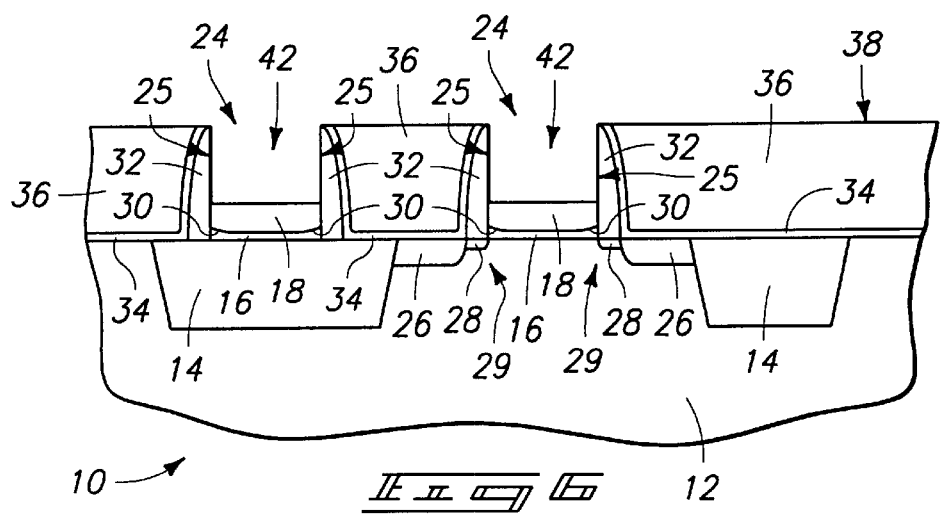

ured construction, including, but not limited to, the semiconductive substrates described above.

METHODS OF FORMING TRANSISTORS

TECHNICAL FIELD

This invention relates to methods of forming transistors and semiconductor processing methods of forming transistor gates.

BACKGROUND OF THE INVENTION

Conductive runners are a fundamental link for components of an integrated circuit for transmitting information. One conventional construction for a conductive runner, for example, a gate line or word line, includes a silicide layer over a silicon layer such as polysilicon. The elecrical resistance of such a construction has become a problem as the semiconductor industry continually strives to decrease the size of components in an integrated circuit. Accordingly, there is a desire in the industry to construct conductive runners with higher conductivity characteristics.

SUMMARY OF THE INVENTION

In accordance with an aspect of the invention, a transistor is formed having a transistor gate, a gate dielectric layer and source/drain regions. The transistor gate includes at least two conductive layers of different conductive materials. One of the two conductive layers is more proximate the gate dielectric layer than the other of the two conductive layers. A source/drain reoxidation is conducted prior to forming the other conductive layer.

In another aspect of the invention, a transistor has a transistor gate, a gate dielectric layer and source/drain regions. The transistor gate includes a tungsten layer. A source/drain reoxidation is conducted prior to forming the tungsten layer of the gate.

In yet another aspect of the invention, a semiconductor processing method forms a transistor gate having insulative sidewall spacers thereover. After forming the insulative sidewall spacers, an outer conductive tungsten layer of the transistor gate is formed.

In still yet another aspect of the invention, a method to form a transistor includes sequentially forming a gate dielectric layer, a first conductive layer, and a sacrificial layer over a semiconductor substrate. The gate dielectric layer, the first conductive layer, and the sacrificial layer are patterned into a transistor gate stack. Insulative sidewall spacers are formed over sidewalls of the gate stack. The sacrificial layer is substantially removed from the gate stack between the spacers. After removing the sacrificial layer, a conductive material is formed between the spacers in electrical connection with the first conductive layer.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with an aspect of the invention.

FIG. 2 is a view of the FIG. 1 wafer fragment at a processing step subsequent to that shown by FIG. 1.

FIG. 3 is a view of the FIG. 1 wafer fragment at a processing step subsequent to that shown by FIG. 2.

FIG. 4 is a view of the FIG. 1 wafer fragment at a processing step subsequent to that shown by FIG. 3.

FIG. 5 is a view of the FIG. 1 wafer fragment at a processing step subsequent to that shown by FIG. 4.

FIG. 6 is a view of the FIG. 1 wafer fragment at a processing step subsequent to that shown by FIG. 5.

DETAILED DESCRIPTION OF THE PREFERRED EMBODIMENTS

Figure 7:
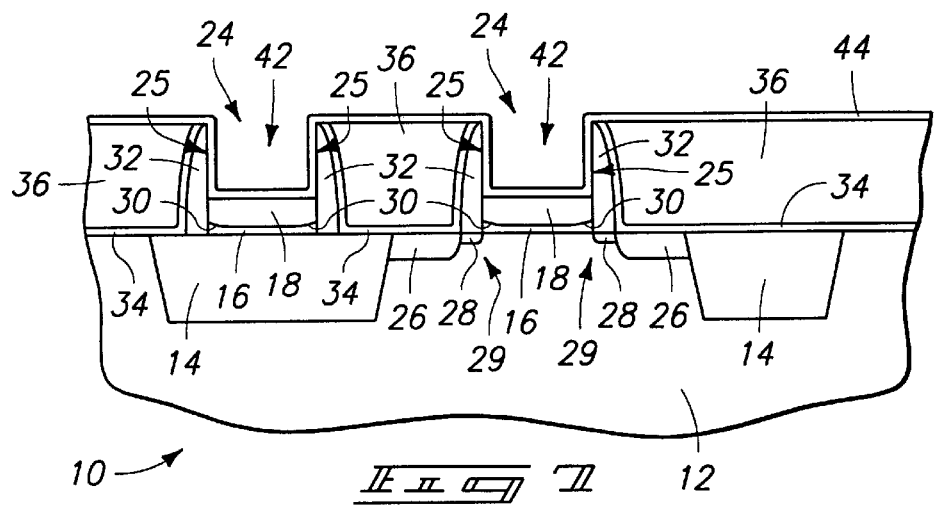
FIG. 7 is a view of the FIG. 1 wafer fragment at a processing step subsequent to that shown by FIG. 6.

This disclosure of the invention is submitted in furtherance of the constitutional purposes of the U.S. Patent Laws "to promote the progress of science and useful arts" (Article 1, Section 8).

The invention was motivated from problems associated with achieving higher conducting runners such as gate lines and word lines. In one example, a layer of tungsten is provided over a layer of polysilicon in a conductive line or runner without silicide being present. Since tungsten is highly reactive to silicon and tends to form a silicide when deposited over the polysilicon layer, an intervening reaction barrier layer of titanium nitride (TiN) is provided over the polysilicon layer prior to depositing the tungsten layer. However, semiconductor wafer fabrication includes many oxidation and reoxidation processes to form an integrated circuit. A problem arises when tungsten is exposed to such oxidation/reoxidation processing because tungsten is a highly oxidative material. Exposing the tungsten to an oxidizing environment detrimentally affects the conductivity characteristics of the tungsten.

For example, typical prior art methods of MOS transistor fabrication form the transistor gate prior to performing reoxidation processing. Such reoxidation processing will expose the tungsten to a detrimental oxidizing environment affecting the overall performance of the transistor. While the invention was principally motivated from overcoming this drawback, the invention is in no way so limited, with the invention only being limited by the accompanying claims.

With reference to FIGS. 1–15, exemplary embodiments of the present invention are illustrated. FIG. 1 depicts a wafer fragment 10 comprising a substrate 12. Substrate 12 may comprise a bulk substrate material of semiconductive or semiconductor material, for example, monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The substrate 12 is provided with isolation regions 14 formed therein, for example, shallow trench isolation regions. A gate dielectric layer 16, a first conductive layer 18 and a sacrificial layer 22 are sequentially formed over substrate 12. An exemplary gate dielectric layer 16 comprises an oxide. An exemplary first conductive layer 18 comprises elemental or alloy metal, or semiconductor material, for example, polysilicon. An exemplary sacrificial layer 22 may be electrically conductive, for example, polysilicon, or in one aspect of the invention, comprises an insulative material, for example, silicon nitride ($Si_3N_4$). The sacrificial layer 22 is selectively etchable relative to proximate materials formed subsequently. In another aspect of the invention, an optional intervening layer 20 is formed over the first conductive layer 18 prior to s forming the sacrificial layer 22. An exemplary intervening layer 20 comprises oxide formed from a TEOS source, or thermally grown from layer 18. Exemplary thicknesses for layers 16, 18, 20 and 22 are 30 angstroms, 1,000 angstroms, 500 angstroms and 1,500 angstroms, respectively.

Referring to FIG. 2, the gate dielectric layer 16, the first conductive layer 18, the intervening layer 20, and the sacrificial layer 22 are patterned to form transistor gate stacks 24. The transistor gate stacks 24 comprise sidewalls 25. An exemplary method to form transistor gate stacks 24 comprises dry etching. A doped region 29 is at least partially formed by doping substrate 12 with a conductivity enhancing impurity. In one aspect of the invention, the method of doping comprises a plurality of ion implants with one exemplary implant forming LDD regions 28. The wafer fragment 10 is exposed to at least one reoxidation step. An exemplary purpose for performing a reoxidation step is to reoxidize existing oxide layers, e.g., layers 16 and 20, thereby enhancing the integrity of the layers. The reoxidation also forms a "gate bird'beak 30" in the gate dielectric layer 16 thereby reducing the overlap capacitance between gate dielectric layer 16 and a source/drain region to be formed subsequently.

Referring to FIG. 3, insulative sidewall spacers 32 are formed laterally adjacent the first conductive layer 18 and sacrificial layer 22 over the sidewalls 25 of the gate stacks 24. An exemplary material for the sidewall spacers 32 comprises undoped oxide, such as silicon dioxide formed from a TEOS source. An exemplary method of forming the sidewall spacers 32 comprises providing an insulative material over the gate stacks 24 and anisotropically etching the insulating material to form the sidewall spacers 32 over sidewalls 25 of gate stacks 24. Another one of the plurality of ion implants is performed in doped region 29 to form, for example, source/drain regions 26. In one aspect of the invention, one of the plurality of ion implants comprises a highest dose compared to all other of the plurality of ion implants. Exemplary conductivity enhancing impurities comprise As and $BF_2$. An oxide layer 34 is formed over the substrate 12, sidewall spacers 32 and gate stacks 24. An exemplary method for forming the oxide layer 34 comprises exposing the wafer fragment 10 to a TEOS source. An insulative layer 36 is formed over the oxide layer 34. An exemplary insulative layer 36 comprises borophosphosilicate glass (BPSG). A rapid thermal process (RTP) is performed to reflow insulative layer 36 (i.e., BPSG) and activate source/drain regions 26. An exemplary RTP comprises a temperature ramp rate of at least 50° C./second to achieve a temperature of at least about 950° C. for a 20 second annealing.

Referring to FIG. 4, portions of the insulative layer 36 are removed to form upper surface 38 thereby forming an exposed surface 40 of sacrificial layer 22. An exemplary method to remove portions of the insulative layer 36 comprises chemical-mechanical polishing (CMP) using a Stop On Nitride (SON) process.

Referring to FIG. 5, the sacrificial layer 22 is substantially removed (preferably entirely) from the gate stack 24 between the sidewall spacers 32 to form recesses 42. An exemplary method to remove the sacrificial layer 22 comprises selectively etching the sacrificial layer 22 relative the sidewall spacers 32, intervening layer 20 and insulative layer 36. Where layer 22 comprises $Si_3N_4$, an example etch would use a conventional hot $H_3PO_4$ strip.

Referring to FIG. 6, the optional intervening layer 20 is removed (for example, by a conventional sputter etch) exposing the first conductive layer 18.

Referring to FIG. 7, a barrier layer 44 is formed within recesses 42 over the first conductive layer 18, the insulative layer 36 and the sidewall spacers 32. Exemplary barrier layers 44 comprise metal nitrides such as TiN formed by physical vapor deposition (PVD).

Figure 8:
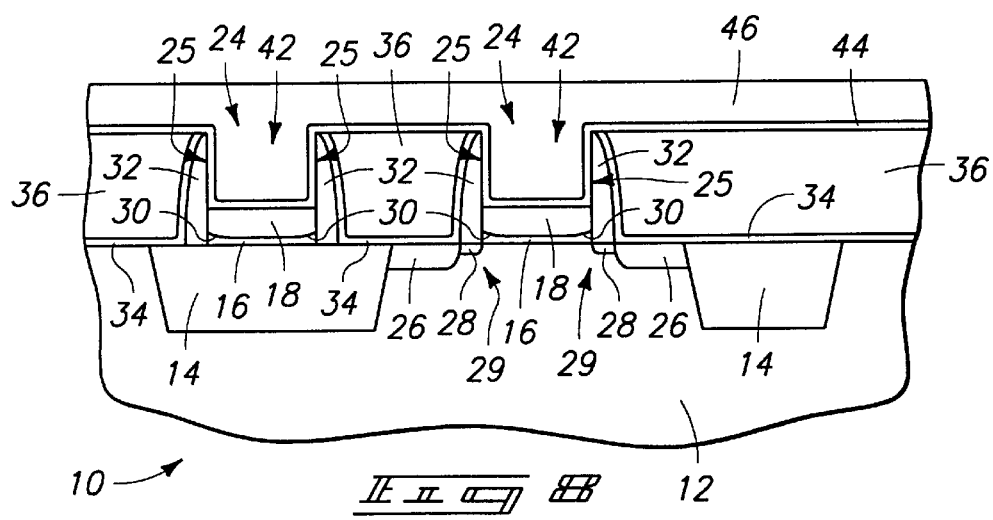
FIG. 8 is a view of the FIG. 1 wafer fragment at a processing step subsequent to that shown by FIG. 7.

Referring to FIG. 8, a conductive material 46 is formed between the spacers 32 in electrical connection with the first conductive layer 18. The conductive material 46 is formed to fill recesses 42 and cover barrier layer 44. Exemplary conductive materials for conductive material 46 comprise elemental metals, alloy metals and refractory metals including their metal silicides and nitrides. Preferably, conductive material 46 predominately comprises tungsten. Exemplary methods for forming conductive material 46 comprise PVD and/or CVD processes.

Figure 9:
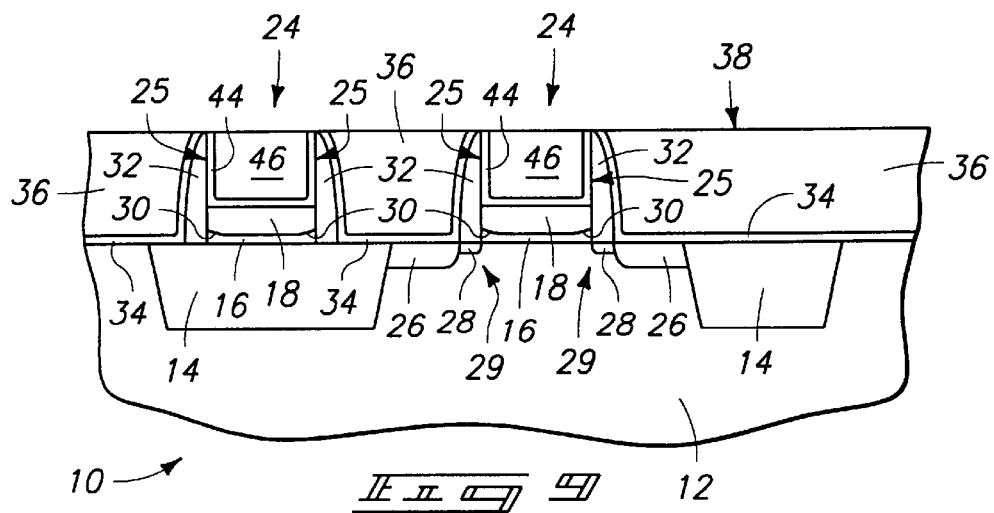
FIG. 9 is a view of the FIG. 1 wafer fragment at a processing step subsequent to that shown by FIG. 8.

Referring to FIG. 9, portions of conductive material 46 and barrier layer 44 are removed (preferably all barrier layer 44 over insulative layer 36 is removed). An exemplary method of removing material 46 and layer 44 comprises CMP down to upper surface 38 of insulative layer 36. The transistor gates shown as gate stacks 24 now comprise at least two conductive layers of different conductive materials, one of the two conductive layers (i.e., layer 18) being more proximate the gate dielectric layer 16 than the other of the two conductive layers (i.e., layer 46). The transistor gates 24 in the preferred embodiment consist essentially of polysilicon, TiN and tungsten.

Figure 10:
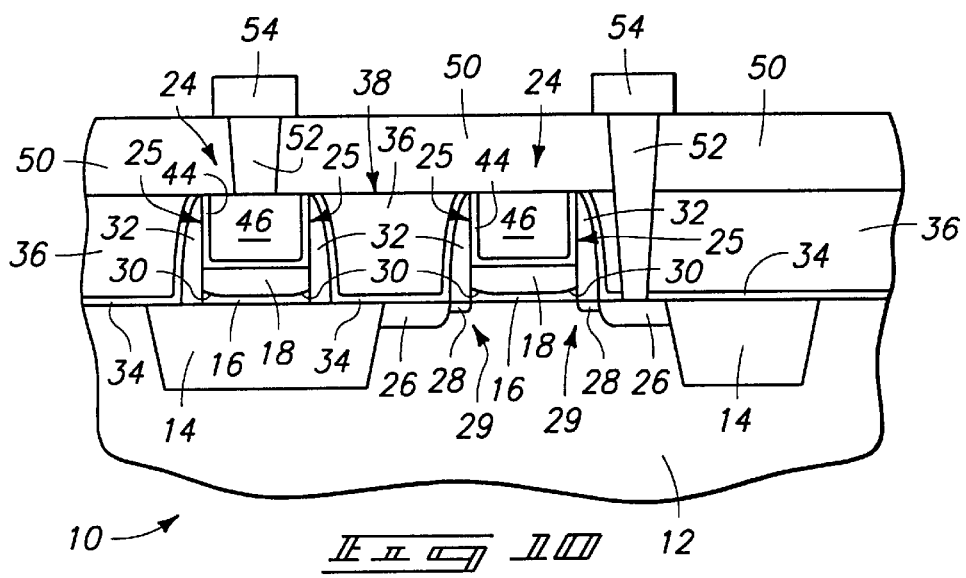
FIG. 10 is a view of the FIG. 1 wafer fragment at a processing step subsequent to that shown by FIG. 9.

Referring to FIG. 10, additional processing comprises forming a dielectric layer 50 over insulative layer 36 and conductive material 46. Metal lines 54 are formed over a portion of dielectric layer 50. Conductive plugs 52 are previously formed which electrically connect the metal lines 54 to the source/drain regions 26 and transistor gates 24.

With reference to FIGS. 11–15, a second embodiment of the present invention is illustrated. Like numerals from the first described embodiment are employed where appropriate, with differences being indicated by the suffix (a) or with different numerals.

Figure 11:
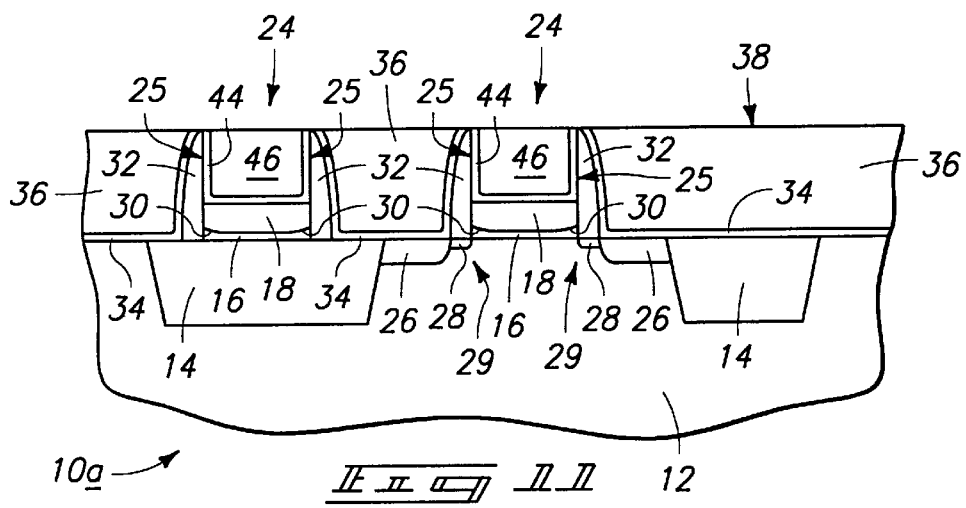
FIG. 11 is a diagrammatic sectional view of a semiconductor wafer fragment at one processing step in accordance with another aspect of the invention.

Referring to FIG. 11, transistor gate 24 comprises conductive material 46 formed between sidewall spacers 32 and over barrier layer 44, and the barrier layer 44 is formed over the first conductive layer 18.

Figure 12:
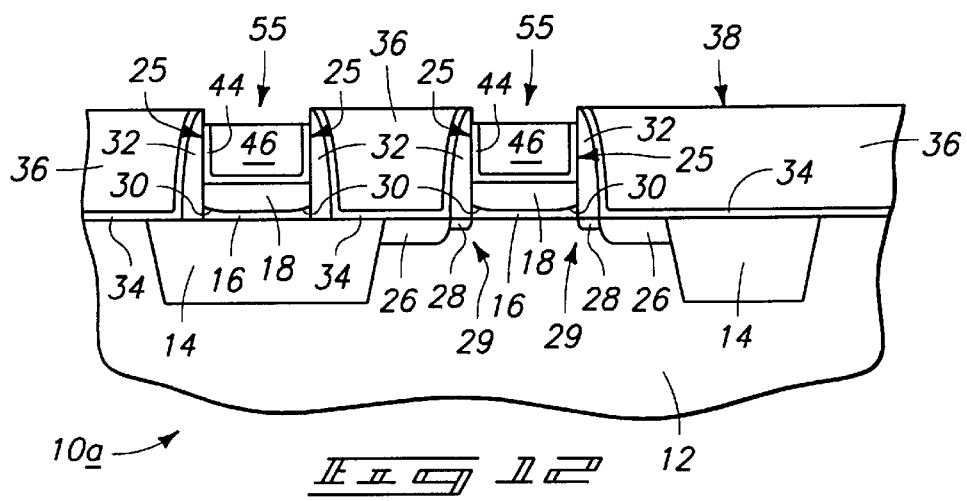
FIG. 12 is a view of the FIG. 11 wafer fragment at a processing step subsequent to that shown by FIG. 11.

Referring to FIG. 12, some of the conductive material 46 is removed from between the sidewall spacers 32 to define recesses 55 between a portion of the sidewall spacers 32. An exemplary method for removing conductive material 46 comprises etching. An exemplary etching process comprises providing wafer 10 in a $NF_3$ or $Cl_2$ plasma environment within a reactive ion etching (RIE) system. An alternative exemplary etching process includes exposing conductive material 46 to a wet cleaning process such as a piranha clean/ammonium peroxide mixture diluted in water. An exemplary mixture comprises ammonium hydroxide, hydrogen peroxide and water having an exemplary composition ratio of 0.25:0.25:5.0 provided at room temperature, preferably at about 75° C. to 85° C. An example preferred etch depth is about 200 angstroms.

Figure 13:
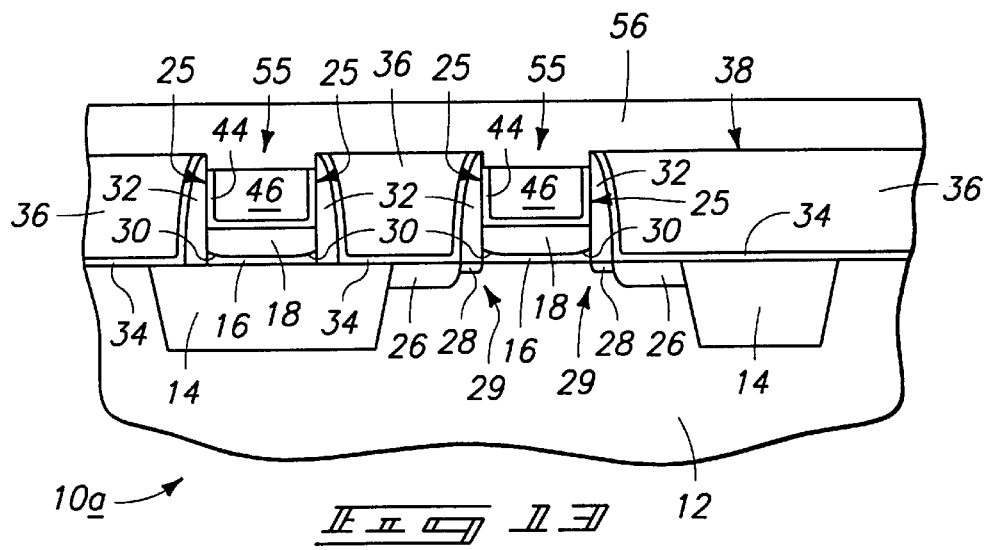
FIG. 13 is a view of the FIG. 11 wafer fragment at a processing step subsequent to that shown by FIG. 12.

Referring to FIG. 13, the etched conductive material 46 is replaced with insulative material 56 formed within recesses 55 and over the insulative layer 36.

Figure 14:
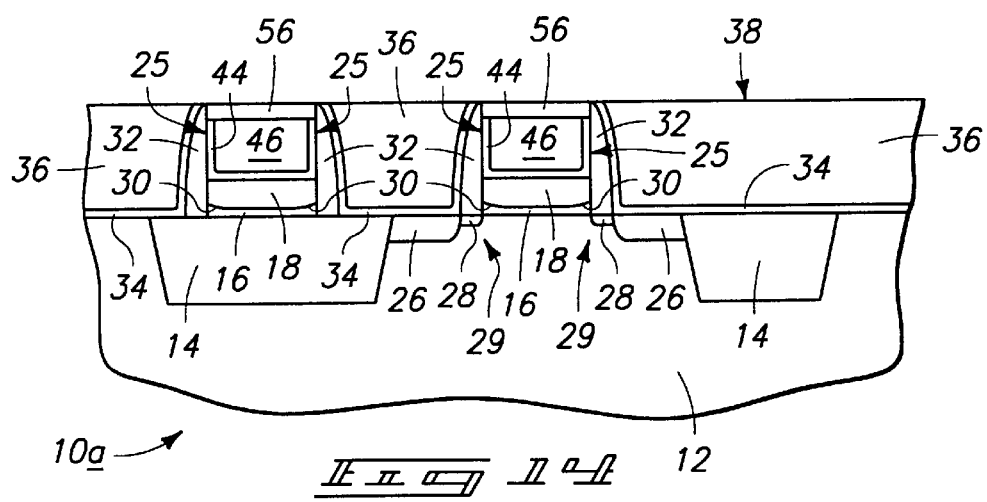
FIG. 14 is a view of the FIG. 11 wafer fragment at a processing step subsequent to that shown by FIG. 13.

Referring to FIG. 14, portions of insulative material 56 are removed down to insulative layer 36 (for example, down to upper surface 38) leaving insulative material 56 over conductive material 46 thereby forming insulative caps 56.

Figure 15:
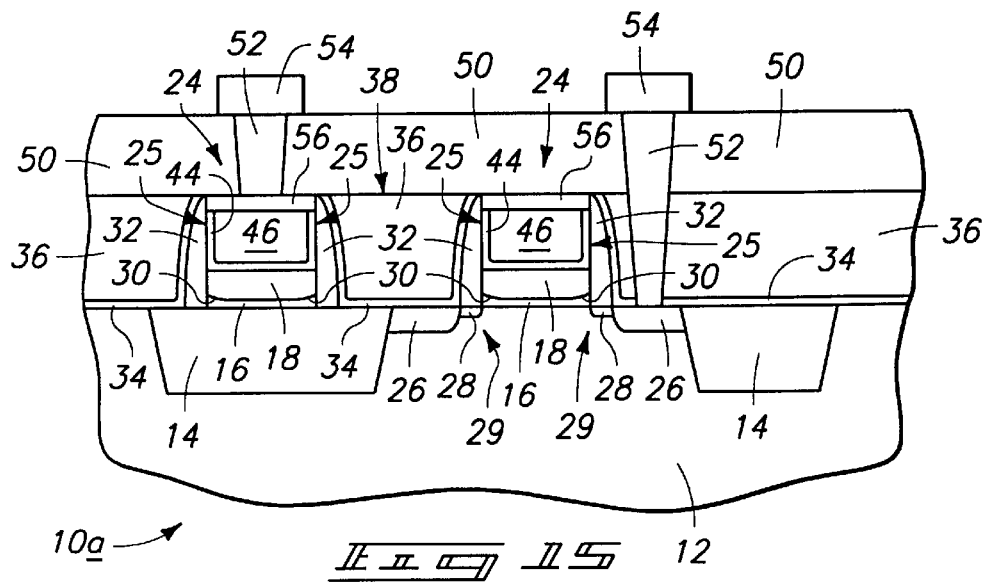
FIG. 15 is a view of the FIG. 11 wafer fragment at a processing step subsequent to that shown by FIG. 14.

Referring to FIG. 15, additional processing comprises forming a dielectric layer 50 over insulative layer 36 and insulative material 56. Metal lines 54 are formed over a portion of dielectric layer 50. Conductive plugs 52 are previously formed, which electrically connect the metal lines 54 to the source/drain regions 26 and transistor gates 24.

In accordance with but one aspect of the invention, all source/drain processing is completed prior to forming the tungsten layer of the transistor gate and can be conducted in any order, in any combination, and by any method. Further in accordance with but one aspect of the invention, all oxidation/reoxidation processing for the transistor fabrication previously described is completed prior to forming the tungsten layer of the transistor gate and can be conducted in any order, in any combination, and by any method.

In accordance with another but one aspect of the invention, a transistor gate comprises at least two conductive layers of different conductive materials. One of the conductive layers is more proximate the gate dielectric layer than the other of the two conductive layers. A source/drain reoxidation is performed prior to forming the other conductive layer.

In accordance with yet another but one aspect of the invention, a transistor gate comprises a tungsten layer and a source/drain reoxidation is formed prior to forming the tungsten layer.

In accordance with still another but one aspect of the invention, a transistor gate comprises at least two conductive layers of different conductive materials. One of the two conductive layers is more proximate a gate dielectric layer than the other of the two conductive layers. Source/drain regions are at least partially formed by a plurality of ion implants and one of said plurality comprises a highest dose compared to all other of said plurality. Sequentially performing the following: depositing the one conductive layer over the gate dielectric layer; conducting the highest dose ion implant for the source/drain regions; and depositing the other conductive layer over the one conductive layer. An alternative sequence, which may or may not include ion implants, comprises performing the following: depositing the one conductive layer over the gate dielectric layer; at least partially forming the source/drain regions by doping with a conductivity enhancing impurity; and depositing the other conductive layer over the one conductive layer. Another alternative sequence comprises etching insulating sidewall spacers over sidewalls of the transistor gate prior to forming the other of the two conductive layers.

In accordance with but one aspect of the invention, a transistor gate has insulative sidewall spacers formed thereover. After forming the insulative sidewall spacers, an outer conductive tungsten layer of the transistor gate is formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a transistor comprising a transistor gate, a gate dielectric layer and source/drain regions, the transistor gate comprising at least two conductive layers of different conductive materials, one of the two conductive layers being more proximate the gate dielectric layer than the other of the two conductive layers, the method comprising conducting a source/drain reoxidation prior to forming the other conductive layer.

2. The method of claim 1 wherein the one conductive layer is formed prior to the conducting the source/drain reoxidation.

3. The method of claim 1 wherein one of the different conductive materials comprises polysilicon.

4. The method of claim 1 wherein the one conductive layer comprises polysilicon.

5. The method of claim 1 wherein the other conductive layer predominately comprises at least one of metal and metal alloy.

6. The method of claim 1 wherein the source/drain regions are completely formed prior to the forming the other conductive layer.

7. A method of forming a transistor comprising a transistor gate, a gate dielectric layer and source/drain regions, the transistor gate comprising a tungsten layer, the method comprising conducting a source/drain reoxidation prior to forming the tungsten layer of the gate.

8. The method of claim 7 comprising forming a conductive layer more proximate the gate dielectric layer than the tungsten layer prior to conducting the source/drain reoxidation.

9. The method of claim 7 wherein the transistor gate comprises at least another conductive layer comprising polysilicon.

10. The method of claim 7 further comprising forming sidewall spacers laterally adjacent the transistor gate prior to forming the tungsten layer.

11. A method of forming a transistor comprising a transistor gate, a gate dielectric layer and source/drain regions, the transistor gate comprising at least two conductive layers of different conductive materials, one of the two conductive layers being more proximate the gate dielectric layer than the other of the two conductive layers, the source/drain regions being at least partially formed by a plurality of ion implants, one of said plurality comprising a highest dose compared to all other of said plurality, the method sequentially comprising:

depositing the one conductive layer over the gate dielectric layer;

conducting the highest dose ion implant for the source/drain regions; and depositing the other conductive layer over the one conductive layer.

12. The method of claim 11 wherein the other conductive layer predominately comprises at least one of metal and metal alloy.

13. The method of claim 11 wherein the other conductive layer is substantially void of silicide.

14. A method of forming a transistor comprising a transistor gate, a gate dielectric layer and source/drain regions comprising conductively doped semiconductive material, the transistor gate comprising at least three conductive layers of different conductive materials, one of the three conductive layers being more proximate the gate dielectric layer than the other two conductive layers, the method sequentially comprising:
  depositing the one conductive layer over the gate dielectric layer;
  at least partially forming the source/drain regions by doping with a conductivity enhancing impurity; and
  depositing the other two conductive layers over the one conductive layer.

15. The method of claim 14 wherein the at least partially forming the source/drain regions comprises completely forming the source/drain regions.

16. The method of claim 14 wherein the doping comprises conducting at least one ion implantation.

17. The method of claim 14 wherein the at least partially forming the source/drain regions comprises conducting a plurality of ion implants.

18. A semiconductor processing method of forming a transistor gate having insulative sidewall spacers thereover, the method comprising after forming the insulative sidewall spacers, forming an outer conductive tungsten layer of the transistor gate.

19. The method of claim 18 wherein the transistor gate comprises two conductive layers and a barrier layer between the two conductive tungsten layer comprises polysilicon.

20. The method of claim 18 wherein the transistor gate comprises at least two conductive layers, and a conductive layer other than the outer conductive tungsten layer comprises TiN.

21. The method of claim 18 wherein the transistor gate consists essentially of polysilicon, TiN and Tungsten.

22. A method of forming a transistor comprising a transistor gate, a gate dielectric layer and source/drain regions, the transistor gate comprising at least two conductive layers of different conductive materials, one of the two conductive layers being more proximate the gate dielectric layer than the other of the two conductive layers, the method comprising forming anisotropically etched insulating sidewall spacers over sidewalls of the transistor gate, the method comprising forming the other of the two conductive gate layers after forming the anisotropically etched insulating sidewall spacers, and the method comprising forming the source/drain regions between forming the one and the other of the two conductive layers.

23. The method of claim 22 wherein the source/drain regions are at least partially formed by conducting a plurality of ion implants, and one of said plurality comprises a highest dose compared to all other of said plurality of ion implants and the ion implant of highest dose is conducted prior to forming the other of the two conductive gate layers.

24. The method of claim 22 further comprising conducting a source/drain reoxidation prior to forming the other of the two conductive gate layers.

25. The method of claim 22 wherein the other of the two conductive gate layers comprises tungsten.

26. The method of claim 22 wherein the other of the two conductive gate layers is substantially void of silicide.

27. A method of forming a transistor comprising:
  providing a substrate including a gate dielectric layer formed thereon and a conductive layer formed over the gate dielectric layer;
  forming a sacrificial layer over the conductive layer;
  at least partially forming source/drain regions;
  forming a pair of sidewall spacers laterally adjacent the conductive layer and sacrificial layer;
  removing the sacrificial layer to expose the conductive layer;
  forming a layer predominately comprising elemental or alloy metal over the conductive layer; and
  conducting a source/drain reoxidation prior to forming the layer comprising elemental or alloy metal.

28. The method of claim 27 wherein the sidewall spacers and sacrificial layer constitute different materials.

29. The method of claim 27 wherein the sidewall spacers predominately comprise silicon dioxide and the sacrificial layer predominately comprises silicon nitride.

30. The method of claim 27 further comprising forming an oxide layer between the conductive layer and the sacrificial layer.

31. The method of claim 27 further comprising completely forming the source/drain regions prior to the forming the layer comprising elemental or alloy metal.

32. The method of claim 27 wherein the source/drain regions are at least partially formed by conducting a plurality of ion implants, and one of said plurality comprises a highest dose compared to all other of said plurality of ion implants, and the ion implant of highest dose is conducted prior to the forming the layer comprising elemental or alloy metal.

33. A method of forming a transistor comprising:
  sequentially forming a gate dielectric layer, a first conductive layer, and a sacrificial layer over a semiconductor substrate;
  patterning the gate dielectric layer, the first conductive layer, and the sacrificial layer into a transistor gate stack;
  forming insulative sidewall spacers over sidewalls of the gate stack;
  removing substantially all the sacrificial layer from the gate stack between the spacers; and
  after the removing, forming two conductive layers of different conductive material between the spacers in electrical connection with the first conductive layer.

34. The method of claim 33 wherein the sacrificial layer comprises insulative material.

35. The method of claim 33 wherein the sacrificial layer is electrically conductive.

36. The method of claim 33 further comprising etching only some of the conductive material from between the sidewall spacers and replacing the etched conductive material with insulative material.

37. The method of claim 33 further comprising:
  prior to forming the sacrificial layer, forming an intervening layer over the first conductive layer;
  wherein removing the sacrificial layer comprises etching the sacrificial layer substantially selective to the intervening layer; and
  prior to forming the conductive material, removing substantially all the intervening layer.

38. The method of claim 33 wherein the conductive material is substantially void of silicide.

39. The method of claim 33 wherein the conductive material comprises elemental or alloy metal.

40. The method of claim 33 comprising after forming the conductive material, etching only some of the conductive material from between the sidewall spacers and replacing the etched conductive material with insulating material.

41. The method of claim 33 further comprising forming a TiN layer between the first conductive layer and the conductive material.

42. A method of forming a transistor comprising: providing a substrate including a gate dielectric layer formed thereon and a conductive layer formed over the gate dielectric layer; forming a sacrificial layer over the conductive layer; at least partially forming source/drain regions; forming a pair of sidewall spacers laterally adjacent the conductive layer and sacrificial layer; removing the sacrificial layer to expose the conductive layer; forming a layer predominately comprising elemental or alloy metal over the conductive layer; removing a portion of the layer comprising elemental or alloy metal to define a recess over the conductive layer between a portion of the sidewall spacers; and providing an insulative material within the recess.

43. A method of forming a transistor comprising a transistor gate, a gate dielectric layer and source/drain regions, the transistor gate comprising at least two conductive layers of different conductive materials, one of the two conductive layers being more proximate the gate dielectric layer than the other of the two conductive layers, the other of the two conductive layers comprising tungsten, the method comprising:

forming a silicon nitride layer over the one conductive layer;

forming an dielectric layer over the silicon nitride layer and transistor gate;

removing a portion of the dielectric to expose the silicon nitride layer;

removing the silicon nitride layer and exposing the one conductive layer;

forming the conductive layer comprising tungsten over the one conductive layer; and prior to the forming the conductive layer comprising tungsten, forming a pair of sidewall spacers laterally adjacent the transistor gate.

44. A method of forming a transistor comprising:

sequentially forming a gate dielectric layer, a first conductive layer, and a sacrificial layer over a semiconductor substrate;

patterning the gate dielectric layer, the first conductive layer, and the sacrificial layer into a transistor gate stack;

forming insulative sidewall spacers over sidewalls of the gate stack;

removing substantially all the sacrificial layer from the gate stack between the spacers;

after the removing, forming conductive material between the spacers in electrical connection with the first conductive layer; and etching only some of the conductive material from between the sidewall spacers and replacing the etched conductive material with insulative material.

45. A method of forming a transistor comprising:

sequentially forming a gate dielectric layer, a first conductive layer, and a sacrificial layer over a semiconductor substrate;

patterning the gate dielectric layer, the first conductive layer, and the sacrificial layer into a transistor gate stack;

forming insulative sidewall spacers over sidewalls of the gate stack;

removing substantially all the sacrificial layer from the gate stack between the spacers;

after the removing, forming conductive material between the spacers in electrical connection with the first conductive layer; and after forming the conductive material, etching only some of the conductive material from between the sidewall spacers and replacing the etched conductive material with insulating material.

* * * * *

UNITED STATES PATENT AND TRADEMARK OFFICE
CERTIFICATE OF CORRECTION

PATENT NO.    : 6,335,254 B1
DATED         : January 1, 2002
INVENTOR(S)   : Jigish G. Trivedi It is certified that error appears in the above-identified patent and that said Letters Patent is hereby corrected as shown below:

<u>Column 3,</u>
Line 17, replace "prior to s forming" with -- prior to forming --.
Line 37, replace ""gate bird'beak 30"" with -- "gate bird's beak 30" --.

<u>Column 8,</u>
Line 64, replace "claim 33 comprising" with -- claim 33 further comprising --.

Signed and Sealed this

Twenty-fifth Day of June, 2002

Attest:

JAMES E. ROGAN
*Attesting Officer*    *Director of the United States Patent and Trademark Office*